(12) United States Patent
Groves et al.

(10) Patent No.: US 8,917,083 B2
(45) Date of Patent: Dec. 23, 2014

(54) STRUCTURES AND METHODS FOR RF DE-EMBEDDING

(75) Inventors: Robert A. Groves, Highland, NY (US); Ning Lu, Essex Junction, VT (US); Christopher S. Putnam, Hinesburg, VT (US); Eric Thompson, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 1027 days.

(21) Appl. No.: 12/953,810

(22) Filed: Nov. 24, 2010

(65) Prior Publication Data

US 2012/0126792 A1  May 24, 2012

(51) Int. Cl.
*G01R 5/14* (2006.01)
*G01R 27/28* (2006.01)
*H01L 21/66* (2006.01)
*G01R 35/00* (2006.01)

(52) U.S. Cl.
CPC ............... *H01L 22/34* (2013.01); *G01R 35/00* (2013.01); *G01R 27/28* (2013.01)
USPC ........................................ 324/140 R

(58) Field of Classification Search
USPC .......... 324/140 R, 141, 76.11, 600, 200, 253, 324/127, 469, 754.31, 76.14, 313, 459
See application file for complete search history.

(56) References Cited

U.S. PATENT DOCUMENTS

| | | |
|---|---|---|
| 6,878,964 B1 | 4/2005 | Lien et al. |
| 6,961,669 B2 | 11/2005 | Brunsman |
| 2007/0126446 A1 | 6/2007 | Szmyd |
| 2009/0051380 A1 * | 2/2009 | Chladek et al. ............... 324/754 |
| 2009/0216480 A1 | 8/2009 | Kuo et al. |
| 2009/0224791 A1 | 9/2009 | Yen et al. |
| 2010/0026315 A1 | 2/2010 | Simpson |
| 2010/0156442 A1 | 6/2010 | Simin et al. |

OTHER PUBLICATIONS

Loo et al., "A Novel De-embedding Technique for On-Wafer Characterization of RF CMOS", IEEE, 2009, pp. 29-32.
Koolen et al., "An Improved De-Embedding Technique for On-Wafer High-Frequency Characterization", IEEE, 1991, pp. 188-191.
Agilent, "De-embedding and Embedding S-Parameter Networks Using a Vector Network Analyzer", May 30, 2004, 24 pages.
Anritsu, "Application Note Embedding/De-embedding", May 2002, 16 pages.
Lee et al., "Application of Area-Saving RF Test Structure on Mobility Extraction", revised Jun. 2009, pp. 98-103.

* cited by examiner

*Primary Examiner* — Melissa Koval
*Assistant Examiner* — Trung Nguyen
(74) *Attorney, Agent, or Firm* — David Cain; Roberts Mlotkowski Safran & Cole, P.C.

(57) ABSTRACT

Electrical structures, methods, and computer program products for radio frequency (RF) de-embedding are provided. A structure includes a first test device, a first through structure corresponding to the first test device, and a first open structure corresponding to the first test device. The structure also includes a second test device having at least one different physical dimension than the first test device but otherwise identical to the first test device, a second through structure corresponding to the second test device, and a second open structure corresponding to the second test device. A method includes determining a first electrical parameter of the first test device in a first DUT structure and a second electrical parameter of the second test device in a second DUT structure based on measured electrical parameters of the first and the second DUT structures, through structures, and open structures.

15 Claims, 13 Drawing Sheets

900

920

940

STRUCTURES AND METHODS FOR RF DE-EMBEDDING

The invention relates to electrical structures and methods of use and, more particularly, to electrical structures, methods, and computer program products for radio frequency (RF) de-embedding.

BACKGROUND

Electrical devices are used to receive and transmit radio frequency (RF) signals. For example, these RF devices may include back-end-of-the-line (BEOL) devices, such as vertical natural capacitors (VNCAP's), metal-insulator-metal capacitors (MIMCAP), BEOL metal resistors, inductors, T-coils, transformers, and interconnect transmission lines. These RF devices may be characterized, or measured for performance, using for example various network parameters, e.g., scattering parameters ("S-parameters"), admittance parameters, and impedance parameters. The process of extracting the intrinsic device network parameters from the raw, measured network parameters of RF devices is called RF de-embedding.

Current RF de-embedding of two-terminal devices (e.g., devices lacking an intrinsic-defined resistive path to ground) leads to inaccurate characterization parameters. For example, current RF de-embedding utilizes a "short" structure including two terminals shorted by a piece of metal and connected to ground, to obtain impedance parameters of a device. Specifically, an impedance of the short structure is measured and subtracted from a measured impedance of a "Device Under Test (DUT)" structure, including two terminals connected to the device being characterized, to rid the DUT measurement of impedances of the two terminals, for instance.

However, the impedance of the short structure may not be much smaller than the impedance of the device being characterized, which in RF de-embedding may result in an improper reduction of the impedance of the device. This often leads to an artificially high value for an extracted quality factor Q and an artificially high value for an extracted self-resonance frequency of a BEOL capacitor (VNCAP) being characterized, and to an artificially low value for an extracted self-inductance of an inductor. Accordingly, there exists a need in the art to overcome the deficiencies and limitations described hereinabove.

SUMMARY

In a first aspect of the invention, a structure includes a first test device, a first through structure corresponding to the first test device, and a first open structure corresponding to the first test device. The structure also includes a second test device having at least one different physical dimension than the first test device but otherwise identical to the first test device, a second through structure corresponding to the second test device, and a second open structure corresponding to the second test device.

In another aspect of the invention, a method of radio frequency (RF) de-embedding includes measuring first scattering parameters (S-parameters) of a first set of structures comprising a first device under test (DUT) structure, a first through structure, and a first open structure, the first through and the first open structures corresponding to the first DUT structure. The method also includes measuring second S-parameters of a second set of structures comprising a second device under test (DUT) structure, a second through structure, and a second open structure, the second through and the second open structures corresponding to the second DUT structure. A first electrical parameter of a first test device in the first DUT structure and a second electrical parameter of a second test device in the second DUT structure are determined based on the first and the second S-parameters, and the first and the second electrical parameters are stored.

In yet another aspect of the invention, a computer program product includes a computer usable storage medium having computer readable program code embodied therein, the computer readable program code comprising an algorithm configured to implement a method of RF de-embedding. The method includes the steps of determining a first measurement of a first device under test (DUT), determining a second measurement of a first through structure corresponding to the first DUT, and determining a third measurement of a first open structure corresponding to the first DUT. The method also includes determining a fourth measurement of a second device under test (DUT), the second DUT having at least one different physical dimension than the first DUT. A fifth measurement of a second through structure corresponding to the second DUT is determined, and a sixth measurement of a second open structure corresponding to the second DUT is determined. A first electrical parameter for the first DUT and a second electrical parameter for the second DUT are calculated based on the first, the second, the third, the fourth, the fifth, and the sixth measurements, and the first electrical parameter and the second electrical parameter are stored.

DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
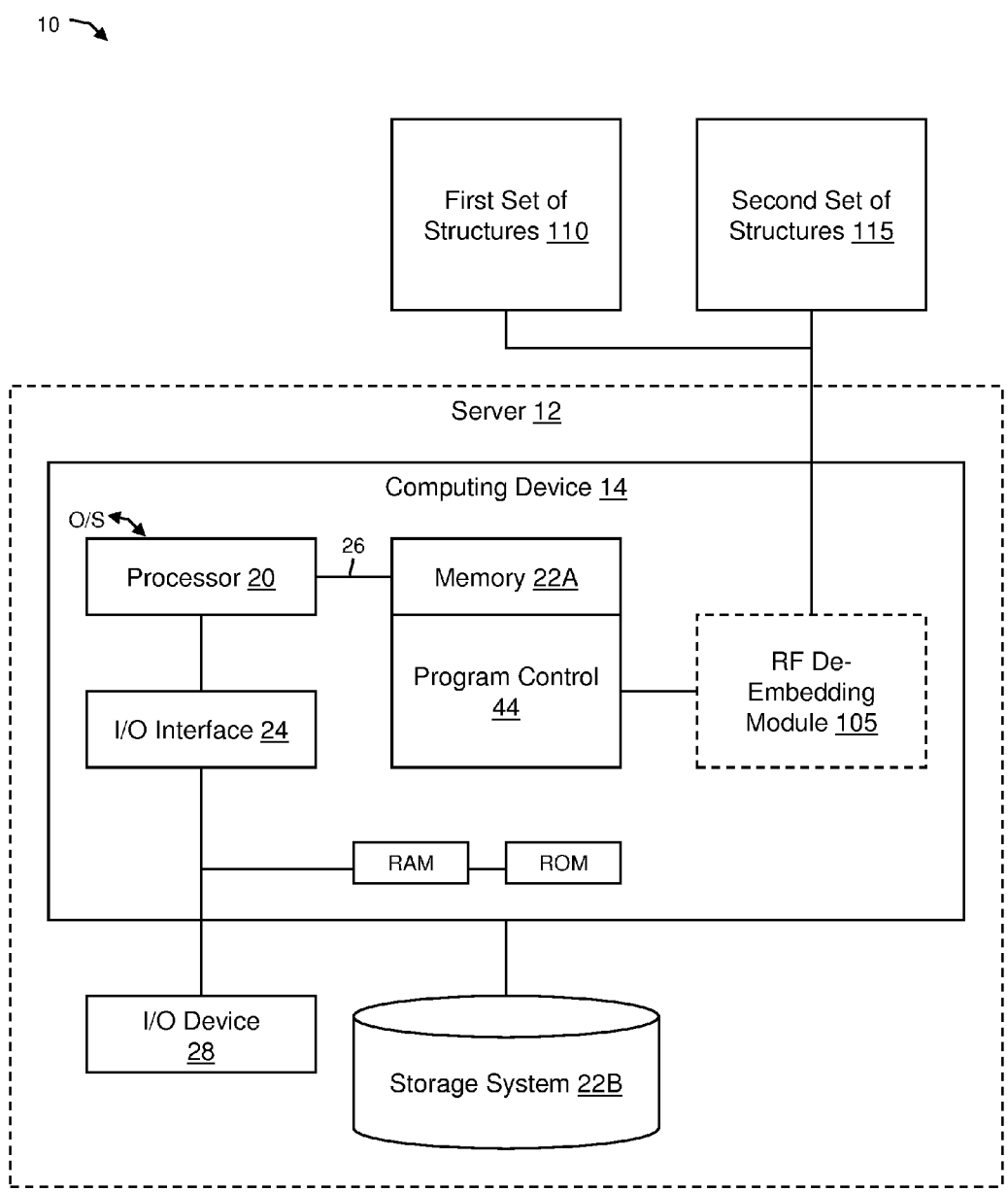
FIG. 1 is an exemplary environment for implementing the steps in accordance with aspects of the invention.

The invention relates to electrical structures and methods of use and, more particularly, to electrical structures, methods, and computer program products for radio frequency (RF) de-embedding. Specifically, the invention provides for using two "through" structures, each of the structures including two terminals connected by a piece of metal, to obtain characterization parameters of an RF, two-terminal device. In the RF de-embedding method of the invention, resistance in these through structures is not completely subtracted from measured RF parameters of two "Device Under Test (DUT)" structures. Advantageously, the invention leads to a more accurate characterization of the RF device, including obtaining a more accurate Quality factor ("Q factor") of the device, for example. The invention is particularly suitable to the RF characterization of back-end-of-the-line (BEOL) devices.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 is an exemplary environment 10 for implementing the steps in accordance with aspects of the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and a storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc.

In general, the processor 20 executes computer program code (e.g., program control 44), which can be stored in the memory 22A and/or storage system 22B. Moreover, in accordance with aspects of the invention, the program control 44 controls an RF de-embedding module 105, e.g., the process described herein. The RF de-embedding module 105 can be implemented as one or more program code in the program control 44 stored in memory 22A as separate or combined modules. Additionally, the RF de-embedding module 105 may be implemented as separate dedicated processors or a single or several processors to provide the function of these tools. While executing the computer program code, the processor 20 can read and/or write data to/from memory 22A, storage system 22B, and/or I/O interface 24. The program code executes the processes of the invention, for example, RF de-embedding or determining characterization parameters of a two-terminal device. The bus 26 provides a communications link between each of the components in the computing device 14.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

The RF de-embedding module 105 determines the characterization parameters of a two-terminal device by probing a first set of structures 110 and a second set of structures 115 including the device. The RF de-embedding module 105 measures scattering parameters ("S-parameters"), or other network parameters, of the first and the second sets of structures 110, 115. In the following Figures, reference will be made to S-parameter; however, those of skill in the art should understand that other network parameters may be measured in place of S-parameters without materially altering the disclosed RF de-embedding methodology of the present invention. Based on these measured S-parameters, the RF de-embedding module 105 may further determine other characterization parameters of the device, such as admittance parameters, and impedance parameters.

Figure 2A:
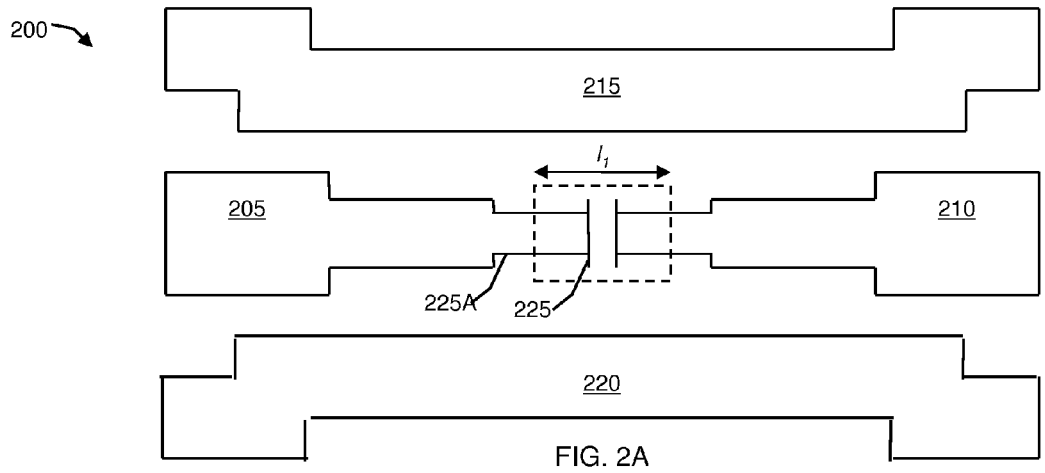
FIGS. 2A-2C are exemplary schematics of a first set of structures used for radio frequency (RF) de-embedding in accordance with aspects of the invention.
Figure 2B:
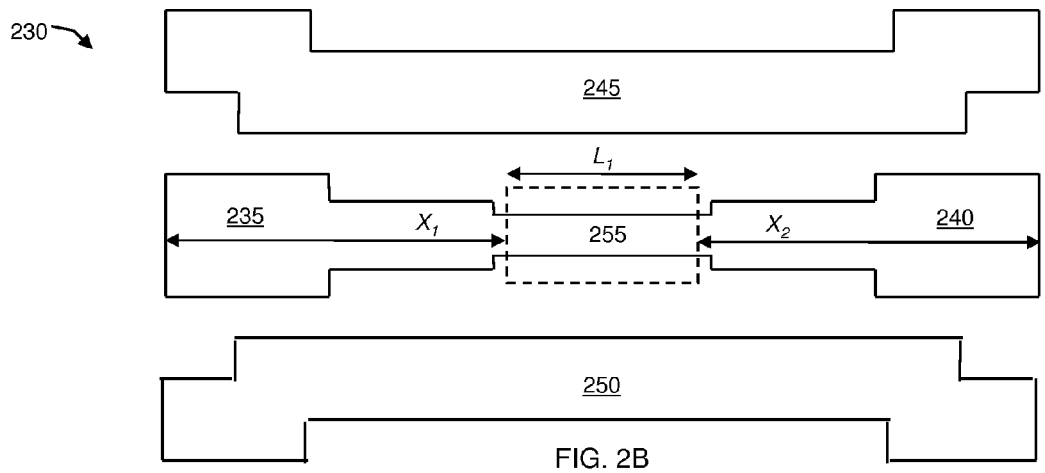
Figure 2C:
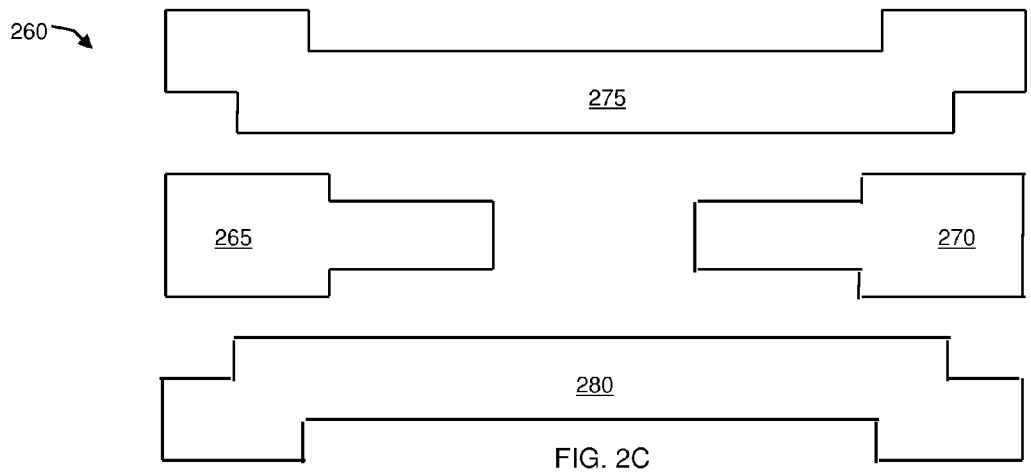

FIGS. 2A-2C are exemplary schematics of a first set of structures (e.g., the first set of structures 110 in FIG. 1) used for the RF de-embedding in accordance with aspects of the invention. More specifically, in FIG. 2A, the first set of structures includes a DUT structure 200 including a first port 205 and a second port 210. In embodiments, the first and the second ports 205, 210 may be an input port and an output port, respectively, the input port receiving a voltage and the output port sending a voltage. A core portion 225A of the DUT structure 200 is not connected to ground portions 215, 220 through a resistive path.

In embodiments, the first and the second ports 205, 210 may be connected to a capacitor 225 (or connected to a BEOL resistor, or connected to an inductor) in series. In the following descriptions, reference will be made to a capacitor; however, those of skill in the art should understand that other two-terminal devices, such as a BEOL resistor, an inductor, and a transformer, may be substituted for a capacitor without materially altering the disclosed RF de-embedding procedure. For example, the capacitor 225 may be a vertical natural capacitor (VNCAP) or any other RF, two-terminal capacitor known in the art. In embodiments, the first and the second ports 205, 210 may be connected in series to any other RF, two-terminal device known in the art. The capacitor 225 has a length $l_1$ and may have a certain width.

In FIG. 2B, the first set of structures also includes a "through" structure 230 including a first port 235 and a second port 240. In embodiments, the first and the second ports 235, 240 may be an input port and an output port, respectively. The input port receives a voltage, and the output port sends a voltage. A core portion 255 of the through structure 230 is not connected to ground portions 245, 250 through a resistive path.

In embodiments, the first and the second ports 235, 240 may be connected to each other by a piece of metal at the core portion 255 of the through structure 230. The core portion 255 is at one BEOL metal level and has a predetermined width and a predetermined pattern. The core portion 255 further has a length $L_1$, which may be determined by a sum of the length $l_1$ of the capacitor 225 and a difference in length $\Delta l$ between the core portion 255 and the capacitor 225. Here, the variable $X_1$ is a length between an end of the core portion 255 and a surface of the first port 235, while the variable $X_2$ is a length between another end of the core portion 255 and a surface of the second port 240.

In addition, in FIG. 2C, the first set of structures includes an "open" structure 260 including a first port 265, a second port 270, and ground portions 275, 280. In the open structure 260, there is not a resistive path among the first port 265, the second port 270, and the ground portions 275, 280. In other words, there is an open circuit among the first port 265, the second port 270, and the ground portions 275, 280.

Figure 3A:
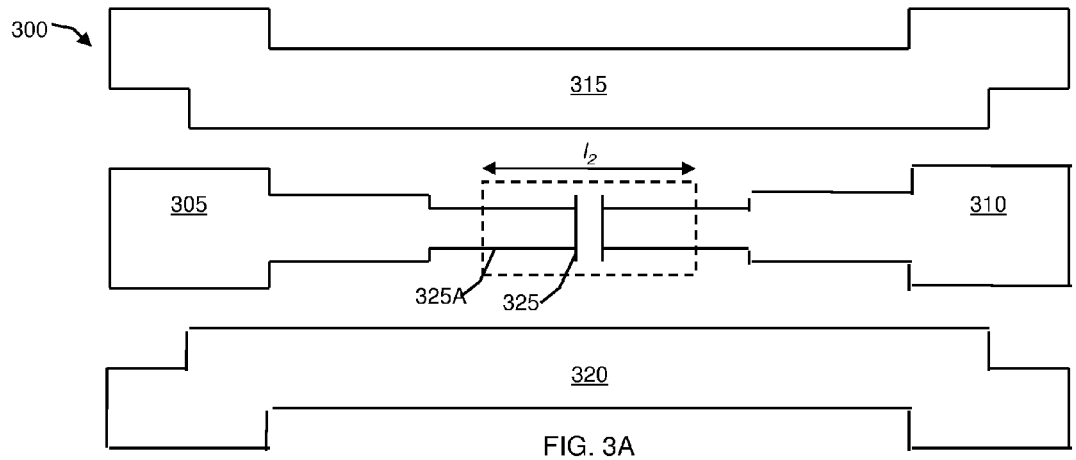
FIGS. 3A-3C are exemplary schematics of a second set of structures used for the RF de-embedding in accordance with aspects of the invention.
Figure 3B:
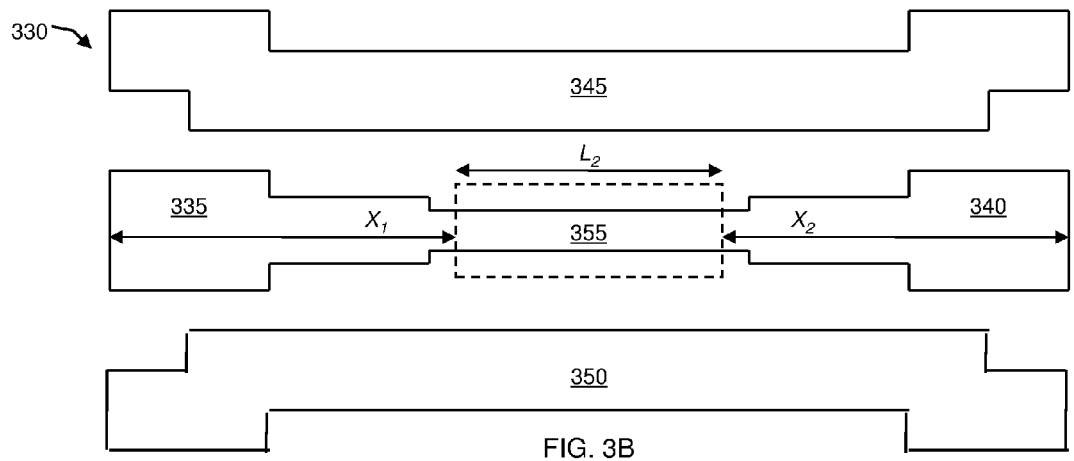
Figure 3C:
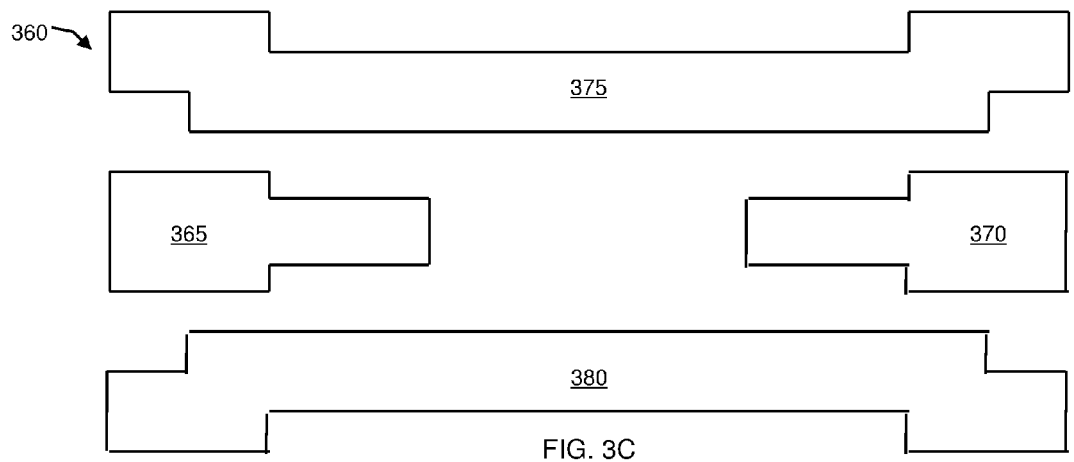

FIGS. 3A-3C are exemplary schematics of a second set of structures (e.g., the second set of structures 115 in FIG. 1)

used for the RF de-embedding in accordance with aspects of the invention. More specifically, in FIG. 3A, the second set of structures includes a DUT structure 300 including a first port 305 and a second port 310. In embodiments, the first and the second ports 305, 310 may be an input port and an output port, respectively, the input port receiving a voltage and the output port sending a voltage. A core portion 325A of the DUT structure 300 is not connected to ground portions 315, 320 through a resistive path.

In embodiments, the first and the second ports 305, 310 may be connected to a capacitor 325 in series. For example, the capacitor 325 may be a vertical natural capacitor (VN-CAP) or any other RF, two-terminal capacitor known in the art. In embodiments, the first and the second ports 305, 310 may be connected in series to any other RF, two-terminal device known in the art. The capacitor 325 has a length $l_2$ and may have a certain width. In other words, the capacitor 325 has a different length than the length $l_1$ of the capacitor 225 of the first DUT structure 200, but may have a same or different width than the width of the capacitor 225.

In FIG. 3B, the second set of structures also includes a "through" structure 330 including a first port 335 and a second port 340. In embodiments, the first and the second ports 335, 340 may be an input port and an output port, respectively. The input port receives a voltage, and the output port sends a voltage. A core portion 355 of the through structure 330 is not connected to ground portions 345, 350 through a resistive path.

In embodiments, the first and the second ports 335, 340 may be connected to each other by a piece of metal at the core portion 355 of the through structure 330. The core portion 355 is at one BEOL metal level and has a predetermined width and a predetermined pattern. These predetermined values for the core portion 355 are the same as those for the core portion 255 of the first through structure 230. The core portion 355 further has a length $L_2$, which may be determined by a sum of the length $l_2$ of the capacitor 325 and a difference in length $\Delta l$ between the core portion 355 and the capacitor 325. That is, the core portion 355 has a different length than the length $L_1$ of the core portion 255 of the first through structure 230. Here, the variable $X_1$ is a length between an end of the core portion 355 and a surface of the first port 335, while the variable $X_2$ is a length between another end of the core portion 355 and a surface of the second port 340.

In addition, in FIG. 3C, the second set of structures includes an "open" structure 360 including a first port 365, a second port 370, and ground portions 375, 380. In the open structure 360, there is not a resistive path among the first port 365, the second port 370, and the ground portions 375, 380. In other words, there is an open circuit among the first port 365, the second port 370, and the ground portions 375, 380.

Figure 4:
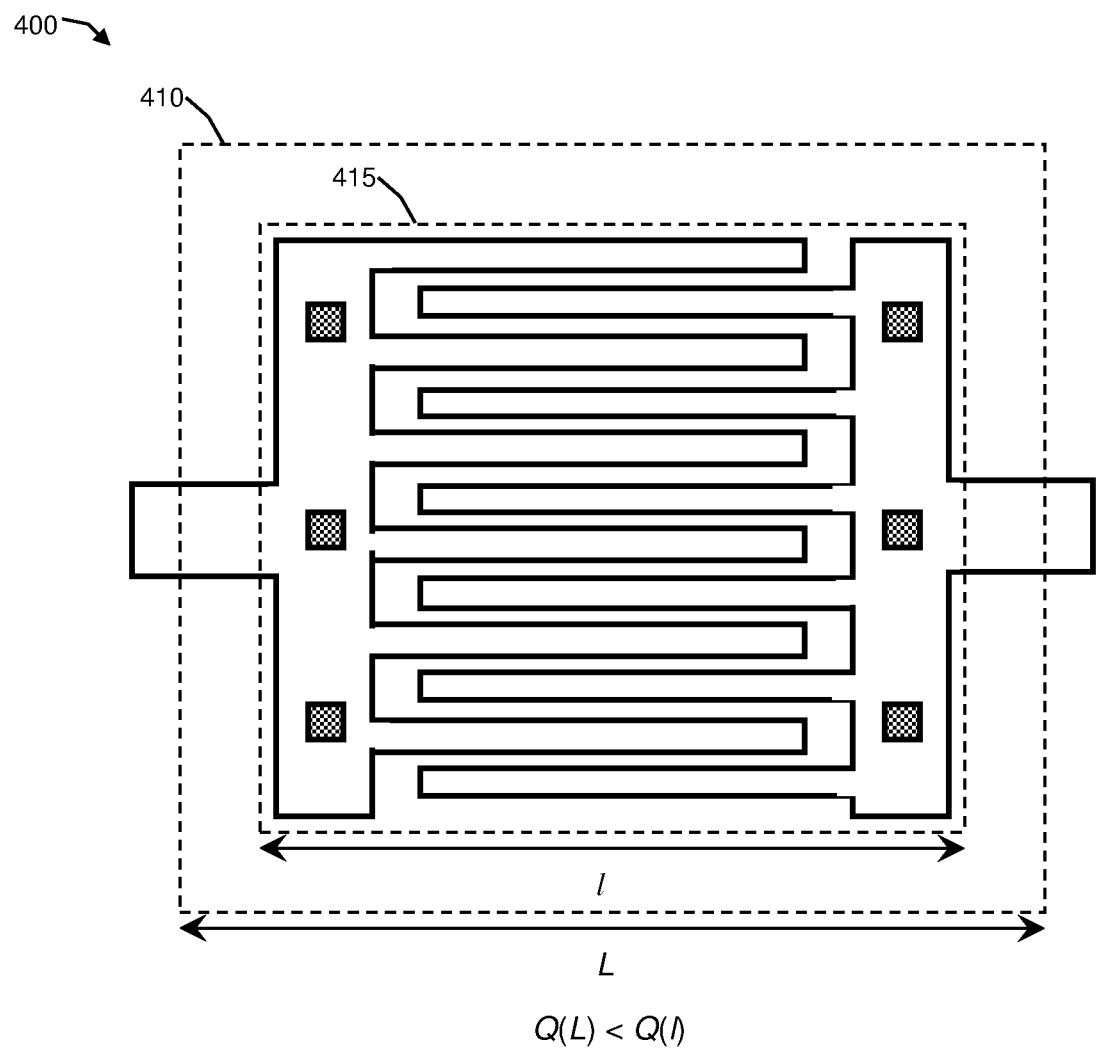
FIG. 4 is an exemplary schematic of a vertical natural capacitor (VNCAP) that may be characterized by the RF de-embedding in accordance with aspects of the present invention.

FIG. 4 is an exemplary schematic of a vertical natural capacitor (VNCAP) 400 that may be characterized by the RF de-embedding in accordance with aspects of the present invention. Specifically, the schematic is a top view of the VNCAP 400. The VNCAP 400 may be connected in series to ports of one of two DUT structures (e.g., the ports 205, 210 of the DUT structure 200, or the ports 305, 310 of the DUT structure 300, in FIGS. 2A and 3A). To characterize a quality factor Q of a given VNCAP layout, there can be different definitions of a characterized device range. The different definitions of the characterized device range lead to different Q values for the same device. For example, one definition of a characterized device range of the given VNCAP 400 has a core portion 415 only with a length l. Another definition of a characterized device range of the same VNCAP 400 has a length L 410, which includes the same core portion 415 plus two segments of wiring out lines. Due to an additional resistance in the two segments of wiring out lines, an effective impedance in the $2^{nd}$ definition of the VNCAP size is larger than that in the $1^{st}$ definition of the VNCAP range. Thus, the quality factor Q(L) associated with the $2^{nd}$ definition of the device size is smaller than the quality factor Q(l) associated with the $1^{st}$ definition of the device size, Q(L)<Q(l).

Figure 5:
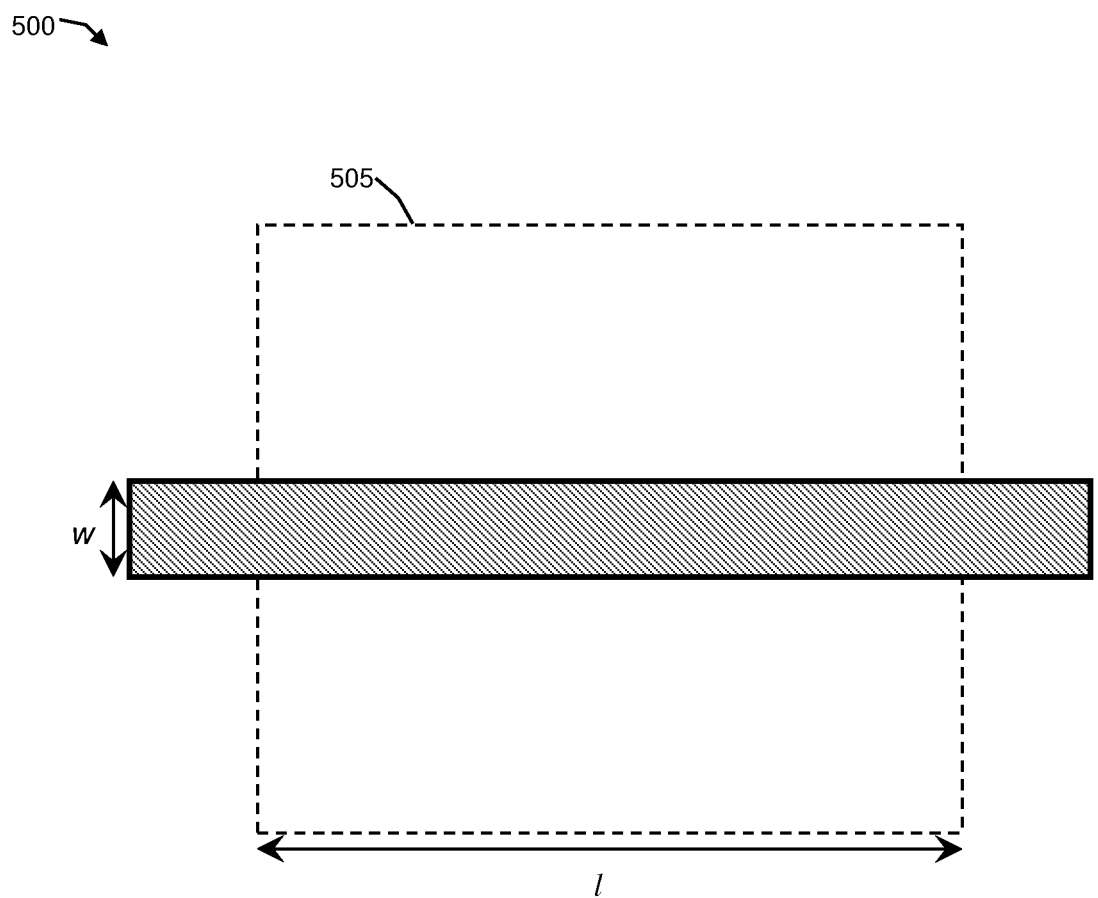
FIG. 5 is an exemplary schematic of a core portion of a "through" structure used for the RF de-embedding in accordance with aspects of the present invention.

FIG. 5 is an exemplary schematic of a core portion 500 of a through structure used for the RF de-embedding in accordance with aspects of the present invention. The core portion 500 may be connected in series to ports of one of two through structures (e.g., the ports 235, 240 of the through structure 230, or the ports 335, 340 of the DUT structure 330, in FIGS. 2B and 3B). In embodiments, the core portion 500 may have a width w (e.g., 1 micron) that is the same as widths of portions of the through structure connected to the core portion 500. The core portion 500 may also have a length l (e.g., 10 microns). The core portion 500 provides an accurate correction of resistance in the core portion 500 of the through structure.

Figure 6A:
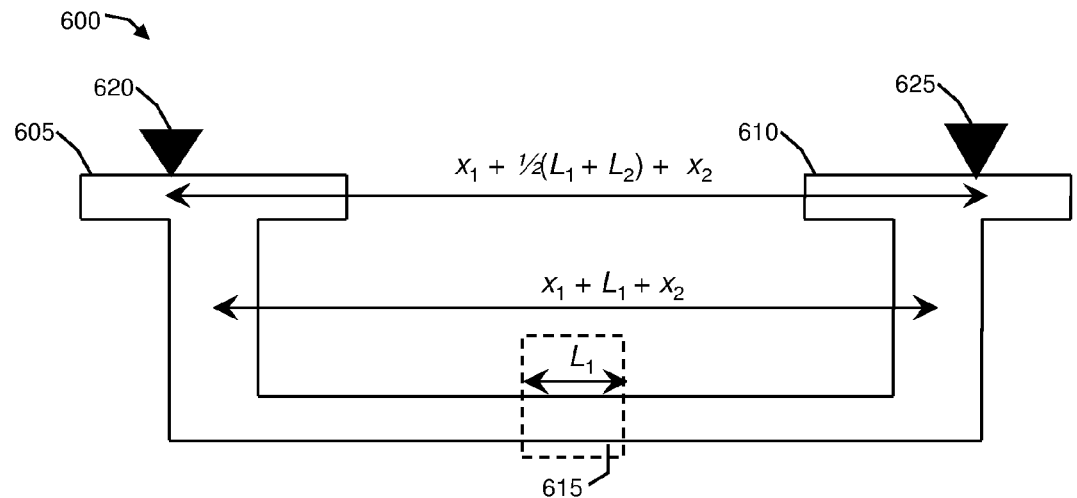
FIGS. 6A-6B are exemplary schematics of a cross-sectional view of structures used for the RF de-embedding in accordance with aspects of the present invention.
Figure 6B:
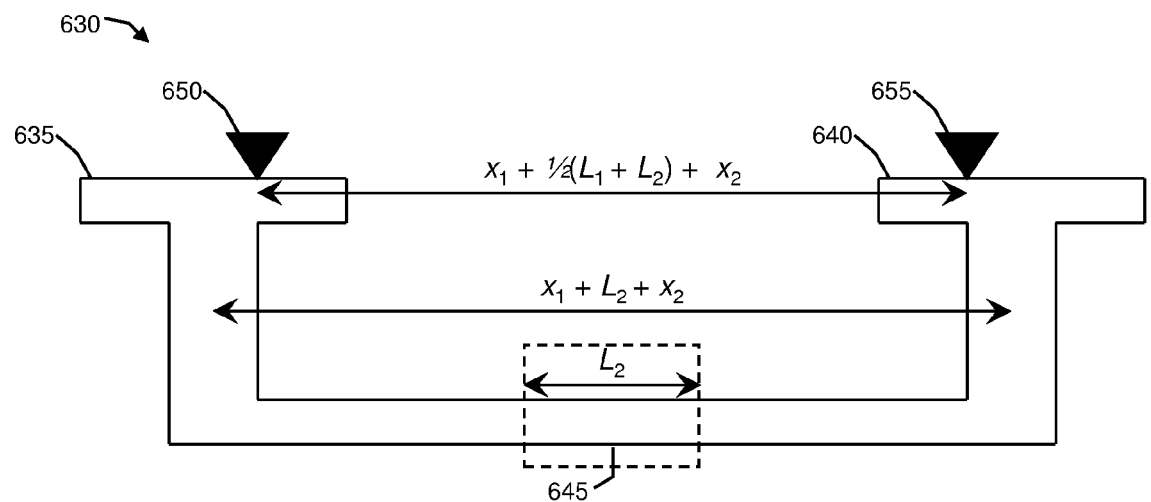

FIGS. 6A-6B are exemplary schematics of a cross-sectional view of structures 600, 630 used for RF de-embedding in accordance with aspects of the present invention. For instance, the structure 600 may include any one of the structures 200, 230, and 260 in FIGS. 2A-2C, while the structure 630 may include any one of the corresponding structures 300, 330, and 360 in FIGS. 3A-3C. In FIG. 6A, the structure 600 includes a first port 605 or signal pad, a second port 610 or signal pad, and a core portion 615 having a length $L_1$. A length between a center of the first port 605 and a center of the second port 610 is $(x_1+L_1+x_2)$. The first and the second ports 605, 610 are in contact with tips of probes 620, 625, respectively. The probes 620, 625 are operable to transfer voltages between the first and the second ports 605, 610, and to a RF de-embedding module (e.g., the RF de-embedding module 105 in FIG. 1).

In FIG. 6B, the structure 630 includes a first port 635 or signal pad, a second port 640 or signal pad, and a core portion 645 having a length $L_2$ that is different than the length $L_1$ of the core portion 615 of the structure 600. A length between a center of the first port 635 and a center of the second port 640 is $(x_1+L_2+x_2)$, which is also different than the length $(x_1+L_1+x_2)$ between the centers of the ports 605, 610 of the structure 600. The first and the second ports 635, 640 are in contact with tips of probes 650, 655, respectively. The probes 650, 655 are operable to transfer voltages between the first and the second ports 635, 640, and to a RF de-embedding module (e.g., the RF de-embedding module 105 in FIG. 1).

In these structures 600, 630, an impedance of a non-core (e.g., $x_1+x_2$) portion of the structure 600 is about the same as an impedance of a non-core portion of the structure 630. Accordingly, for measurement efficiency, the probes 620, 625 of the structure 600 may be placed a same distance apart as the probes 650, 655 of the structure 630, for example, the distance $[x_1+\frac{1}{2}(L_1+L_2)+x_2]$, even though the lengths $L_1$ and $L_2$ are different.

Using the first and the second sets of structures in FIGS. 2-3, the invention provides for RF de-embedding of the capacitor 225, the capacitor 325, and/or any other RF, two-terminal device known in the art that are placed in the sets of structures. More specifically, for the capacitor 225, the RF de-embedding module 105 measures three separate 2×2 S-parameter matrices $S_{dut1}$, $S_{through1}$, and $S_{open1}$ utilizing the DUT structure 200, the through structure 230, and the open structure 260, respectively. For example, the S-parameter matrix $S_{dut1}$ may be given by:

$$S_{dut1} = \begin{pmatrix} S_{11} & S_{12} \\ S_{21} & S_{22} \end{pmatrix}, \quad (1)$$

where $S_{11}$ is a voltage reflection coefficient of the input port 205, $S_{12}$ is a reverse voltage gain, $S_{21}$ is a forward voltage gain, and $S_{22}$ is a voltage reflection coefficient of the output port 210.

The RF de-embedding module 105 then determines three separate 2×2 admittance parameter ("Y-parameter") matrices $Y_{dut1}$, $Y_{through1}$, and $Y_{open1}$ that correspond to the matrices $S_{dut1}$, $S_{through1}$, and $S_{open1}$, respectively. For the capacitor 325, the RF de-embedding module 105 measures three separate 2×2 S-parameter matrices $S_{dut2}$, $S_{through2}$, and $S_{open2}$ utilizing the DUT structure 300, the through structure 330, and the open structure 360, respectively. The RF de-embedding module 105 then determines three separate 2×2 Y-parameter matrices $Y_{dut2}$, $Y_{through2}$, and $Y_{open2}$ that correspond to the matrices $S_{dut2}$, $S_{through2}$, and $S_{open2}$, respectively.

Next, the RF de-embedding module 105 subtracts admittances of "parallel" components (e.g., the first and second ports) from the admittance of each of the DUT structures 200, 300 and the through structures 230, 330. This is accomplished by subtracting the admittance of the open structure 260 from the DUT structure 200 and the through structure 230, and subtracting the admittance of the open structure 360 from the DUT structure 300 and the through structure 330. As a result, the following open-corrected Y-parameter matrices $Y^{do1}$, $Y^{to1}$, $Y^{do2}$, and $Y^{to2}$ are determined based on the following equations:

$$Y^{do1} = Y_{dut1} - Y_{open1}; \quad (2a)$$

$$Y^{to1} = Y_{through1} - Y_{open1}; \quad (2b)$$

$$Y^{do2} = Y_{dut2} - Y_{open2}; \text{ and} \quad (2c)$$

$$Y^{to2} = Y_{through2} - Y_{open2}. \quad (2d)$$

Using the open-corrected Y-parameter matrices $Y^{to1}$ and $Y^{to2}$, the RF de-embedding module 105 determines open-corrected impedance parameter ("Z-parameters") matrices $Z^{to1}$ and $Z^{to2}$ of the through structures 230, 330 based on the following equations:

$$Z^{to1} \equiv (Y^{to1})^{-1} = \begin{pmatrix} Z_{11}^{to1} & Z_{12}^{to1} \\ Z_{21}^{to1} & Z_{22}^{to1} \end{pmatrix}; \text{ and} \quad (3a)$$

$$Z^{to2} \equiv (Y^{to2})^{-1} = \begin{pmatrix} Z_{11}^{to2} & Z_{12}^{to2} \\ Z_{21}^{to2} & Z_{22}^{to2} \end{pmatrix}. \quad (3b)$$

Figure 7A:
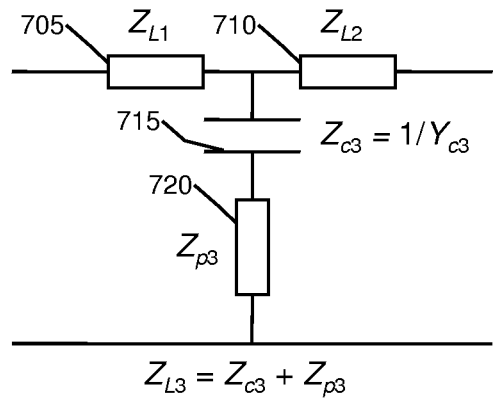
FIGS. 7A-7B are exemplary schematics of equivalent circuits of open-corrected impedance parameter ("Z-parameters") matrices in accordance with aspects of the present invention.
Figure 7B:
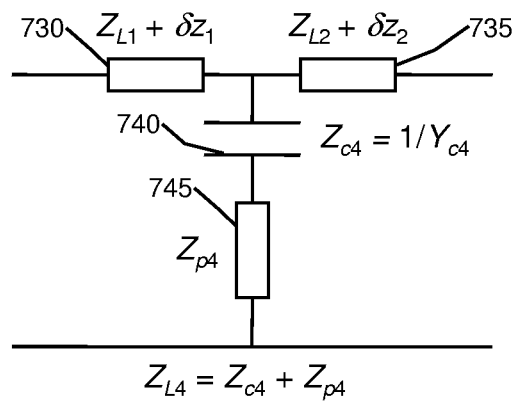

FIGS. 7A-7B are exemplary schematics of equivalent circuits 700, 725 of the open-corrected Z-parameter matrices in accordance with aspects of the present invention. Specifically, in FIG. 7A, the circuit 700 is the equivalent circuit of the open-corrected Z-parameter matrix $Z^{to1}$ for the through structure 230, which may be denoted as follows:

$$Z^{to1} \equiv (Y^{to1})^{-1} = \begin{pmatrix} Z_{L1} + Z_{L3} & Z_{L3} \\ Z_{L3} & Z_{L2} + Z_{L3} \end{pmatrix} \quad (4a)$$

where $Z_{L1}$ is an impedance of the first port 235, $Z_{L2}$ is the impedance of the second port 240, and $Z_{L3}$ is an impedance to the ground portions 245, 250 in the through structure 230.

The equivalent circuit 700 includes a resistor-inductor, series-connected pair 705 (e.g., the first port 235) having the impedance $Z_{L1}$, and a resistor-inductor, series-connected pair 710 (e.g., the second port 240) having the impedance $Z_{L2}$. The equivalent circuit 700 also includes a capacitor 715 (e.g., the capacitance to ground of an internal through structure device) having an impedance $Z_{c3}$, and a resistor-inductor, series-connected pair 720 (e.g., a padset parasitic) having an impedance to ground $Z_{p3}$. The impedance $Z_{c3}$ is equal to an inverse of an admittance $Y_{c3}$, of the capacitor 715. The impedance to ground $Z_{L3}$ in the through structure 230 is equal to the sum of the impedance $Z_{c3}$ of the capacitor 715 and the impedance to ground $Z_{p3}$ of the resistor-inductor pair 720. An impedance from the first port 235 to the second port 240 of the through structure 230, with resistance and inductance at a low frequency, is $(Z_{L1} + Z_{L2}) = (Z_{11}^{to1} + Z_{22}^{to1} - Z_{21}^{to1} - Z_{12}^{to1})$.

In FIG. 7B, the circuit 725 is the equivalent circuit of the open-corrected Z-parameter matrix $Z^{to2}$ for the through structure 330, which may be denoted as follows:

$$Z^{to2} \equiv (Y^{to2})^{-1} = \begin{pmatrix} Z_{L1} + \delta z_1 + Z_{LA} & Z_{LA} \\ Z_{LA} & Z_{L2} + \delta z_2 + Z_{LA} \end{pmatrix} \quad (4b)$$

where $(Z_{L1} + \delta z_1)$ is an impedance of the first port 335, $(Z_{L2} + \delta z_2)$ is the impedance of the second port 340, and $Z_{LA}$ is an impedance to the ground portions 345, 350 in the through structure 330.

The equivalent circuit 725 includes a resistor-inductor, series-connected pair 730 (e.g., the first port 335) having the impedance $(Z_{L1} + \delta z_1)$, and a resistor-inductor, series-connected pair 735 (e.g., the second port 340) having the impedance $(Z_{L2} + \delta z_2)$. The equivalent circuit 725 also includes a capacitor 740 (e.g., the capacitance to ground of an internal through structure device) having an impedance $Z_{c4}$, and a resistor-inductor, series-connected pair 745 (e.g., a padset parasitic) having an impedance to ground $Z_{p4}$. The impedance $Z_{c4}$ is equal to an inverse of an admittance $Y_{c4}$, of the capacitor 740. The admittance $Y_{c4}$ of the capacitor 740 is equal to a sum of the admittance $Y_{c3}$ of the capacitor 715 and a difference $\Delta y$ of the two admittances $Y_{c4}$ and $Y_{c3}$. The impedance to ground $Z_{LA}$ in the through structure 330 is equal to the sum of the impedance $Z_{c4}$ of the capacitor 740 and the impedance to ground $Z_{p4}$ of the resistor-inductor pair 745. An impedance from the first port 335 to the second port 340 of the through structure 330, with resistance and inductance at a low frequency, is $(Z_{L1} + \delta z_1 + Z_{L2} + \delta z_2) = (Z_{11}^{to2} + Z_{22}^{to2} - Z_{21}^{to2} - Z_{12}^{to2})$.

In order to further de-embed the open-corrected Y-parameter matrices $Y^{do1}$ and $Y^{do2}$ of the DUT structures 200, 300, the open-corrected Z-parameter matrices $Z^{to1}$ and $Z^{to2}$ for the through structure 230, 330 need to be subtracted from open-corrected Z-parameter matrices of the DUT structures 200, 300. This subtraction unambiguously removes padset parasitics from the measurement of the DUT structures 200, 300, since the open-corrected Z-parameter matrices of the DUT structures 200, 300 includes a series combination of impedances of the padset parasitics and of internal DUT structure devices. However, in order to avoid subtracting internal impedances (i.e., impedances of the core portions 255 and 355) of the through structures 230, 330, internal impedance matrices of the through structures 230, 330 ("impedance corrections") must be determined and added back into the de-embedded, open-corrected Y-parameter matrices $Y^{do1}$ and $Y^{do2}$ of the DUT structures 200, 300.

Accordingly, to determine the impedance corrections and using the open-corrected Z-parameter matrices $Z^{to1}$ and $Z^{to2}$ of the through structures 230, 330, the RF de-embedding module 105 determines a difference matrix $\Delta z$ between these Z-parameter matrices $Z^{to1}$ and $Z^{to2}$ based on the following equation:

$$\Delta z \equiv \begin{pmatrix} \Delta z_{11} & \Delta z_{12} \\ \Delta z_{21} & \Delta z_{22} \end{pmatrix} = Z^{to2} - Z^{to1}. \quad (5)$$

Figure 8:
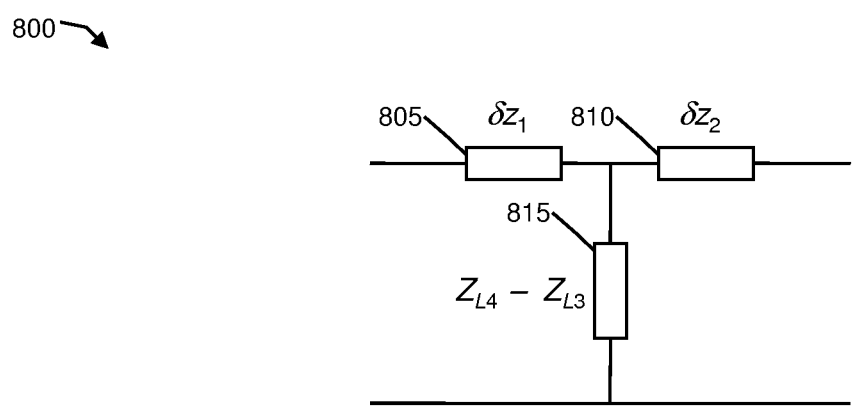
FIG. 8 is an exemplary schematic of an equivalent circuit of a difference matrix of the open-corrected Z-parameter matrices in accordance with aspects of the present invention.

FIG. 8 is an exemplary schematic of equivalent circuit 800 of the difference matrix between the open-corrected Z-parameter matrices in accordance with aspects of the present invention. Specifically, the circuit 800 is the equivalent circuit of the difference matrix $\Delta z$ between the open-corrected Z-parameter matrices $Z^{to1}$ and $Z^{to2}$, which is found from Eqs. (5), (4a), and (4b) to be:

$$\Delta z = Z^{to2} - Z^{to1} = \begin{pmatrix} \delta z_1 + Z_{L4} - Z_{L3} & Z_{L4} - Z_{L3} \\ Z_{L4} - Z_{L3} & \delta z_2 + Z_{L4} - Z_{L3} \end{pmatrix}. \quad (6)$$

The equivalent circuit 800 includes a resistor-inductor, series-connected pair 805 having a difference impedance $\delta z_1$, a resistor-inductor, series-connected pair 810 having a difference impedance $\delta z_2$, and a resistor-inductor, series-connected pair 815 having an impedance to ground $(Z_{L4}-Z_{L3})$. A difference between the impedances of the through structures 230, 330 is thus obtained from the difference matrix $\Delta z$ and is equal to $(\delta z_1+\delta z_2)=(\Delta z_{11}+\Delta z_{22}-\Delta z_{21}-\Delta z_{12})$. An impedance difference per unit length $\delta z$ is given by:

$$\delta z = \frac{\Delta z_{11} + \Delta z_{22} - \Delta z_{21} - \Delta z_{12}}{L_2 - L_1}. \quad (7)$$

The above impedance difference per unit length $\delta z$ can be partitioned into two parts:

$$\delta z = \delta z_l + \delta z_r, \text{ where} \quad (8a)$$

$$\delta z_l = \frac{\Delta z_{11} - \Delta z_{21}}{L_2 - L_1}, \text{ and} \quad (8b)$$

$$\delta z_r = \frac{\Delta z_{22} - \Delta z_{12}}{L_2 - L_1}. \quad (8c)$$

After determining the difference matrix $\Delta z$, the RF de-embedding module 105 determines internal impedance matrices of the through structures 230, 330 ("impedance corrections"). To accomplish this, in embodiments, the RF de-embedding module 105 may determine the impedance to ground $Z_{L4}$ in the through structure 330 based on the following equation:

$$Z_{L4} = \frac{1}{2}(Z_{21}^{to2} + Z_{12}^{to2}). \quad (9a)$$

The impedance to ground $Z_{L3}$ in the through structure 230 may also be determined based on the following equation:

$$Z_{L3} = \frac{1}{2}(Z_{21}^{to1} + Z_{12}^{to1}). \quad (9b)$$

When both the through structure 230 and the open structure 260 are symmetric (or from the viewpoint of a T-network for a Z-parameter matrix), the impedance $Z_{21}^{to1}$ is equal to the impedance $Z_{12}^{to1}$, and thus, the impedance to ground $Z_{L3}$ is equal to the impedances $Z_{21}^{to1}$ and $Z_{12}^{to1}$. Similarly, when both the through structure 330 and the open structure 360 are symmetric, the impedance $Z_{21}^{to2}$ is equal to the impedance $Z_{12}^{to2}$, and thus, the impedance to ground $Z_{L4}$ is equal to the impedances $Z_{21}^{to2}$ and $Z_{12}^{to2}$.

Using the impedances to ground $Z_{L4}$ and $Z_{L3}$ in the through structures 330, 230, respectively, the RF de-embedding module 105 may determine a difference $\Delta y$ between admittances to ground in the through structures 330, 230. In a first embodiment, at low frequency in the through structure 230, the impedance to ground $|Z_{p3}|$ of the padset parasitic may be safely assumed to much smaller than the impedance to ground $|Z_{c3}|$ of the internal through structure device. Similarly, at low frequency in the through structure 330, the impedance to ground $|Z_{p4}|$ of the padset parasitic may be safely assumed to be much smaller than the impedance to ground $|Z_{c4}|$ of the internal through structure device. Accordingly, the impedances to ground $|Z_{p3}|$ and $|Z_{p4}|$ of the padset parasitics may be approximated to a zero value. After this approximation, an admittance to ground in the through structure 330 is proportional to capacitance at low frequency, or is $1/Z_{L4}$. An admittance to ground in the through structure 230 is proportional to capacitance at low frequency, or is $1/Z_{L3}$. The difference $\Delta y$ between the admittances to ground in the through structures 330, 230 is determined based on the following equation:

$$\Delta y = \frac{1}{Z_{L4}} - \frac{1}{Z_{L3}}. \quad (10)$$

Figure 9A:
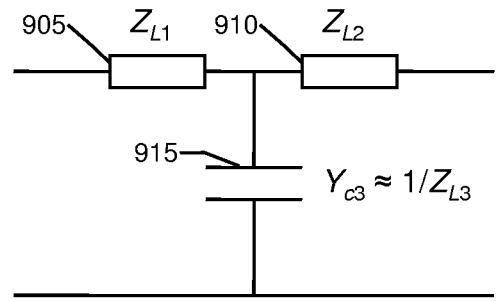
FIGS. 9A-9B are other exemplary schematics of equivalent circuits of the open-corrected Z-parameter matrices in accordance with aspects of the present invention.
Figure 9B:
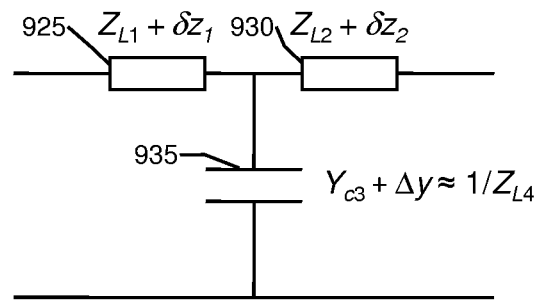

FIGS. 9A-9B are other exemplary schematics of equivalent circuits 900, 920 of the open-corrected Z-parameter matrices in accordance with aspects of the present invention. Specifically, in FIG. 9A, the circuit 900 is the equivalent circuit of the open-corrected Z-parameter matrix $Z^{to1}$ for the through structure 230. The equivalent circuit 900 includes a resistor-inductor, series-connected pair 905 (e.g., the first port 235) having the impedance $Z_{L1}$, and a resistor-inductor, series-connected pair 910 (e.g., the second port 240) having the impedance $Z_{L2}$. The equivalent circuit 900 also includes a capacitor 915 (e.g., the capacitance to ground of the internal through structure device) having the admittance to ground $Y_{c3}$, which is approximately equal to $1/Z_{L3}$. The padset parasitic $Z_{p3}$ of the through structure 230 is approximated to a zero value.

In FIG. 9B, the circuit 920 is the equivalent circuit of the open-corrected Z-parameter matrix $Z^{to2}$ for the through structure 330. The equivalent circuit 920 includes a resistor-inductor, series-connected pair 925 (e.g., the first port 335) having the impedance $(Z_{L1}+\delta z_1)$, and a resistor-inductor, series-connected pair 930 (e.g., the second port 340) having the impedance $(Z_{L2}+\delta z_2)$. The equivalent circuit 920 also includes a capacitor 935 (e.g., the capacitance to ground of the internal through structure device) having an admittance to ground $(Y_{c3}+\Delta y)$, which is approximately equal to $1/Z_{L4}$. The padset parasitic $Z_{p4}$ of the through structure 330 is approximated to a zero value.

Figure 9C:
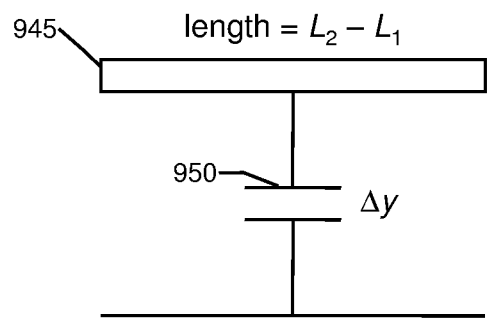
FIG. 9C is an exemplary schematic of an equivalent circuit of a difference between impedances to ground in the through structures in accordance with aspects of the present invention.

FIG. 9C is an exemplary schematic of an equivalent circuit 940 of the difference between admittances to ground in the through structures 230, 330 in accordance with aspects of the present invention. The equivalent circuit 940 has a length 945 of ($L_2-L_1$) and includes a capacitor 950 having an admittance equal to the difference $\Delta y$ between admittances to ground in the through structures 330, 230.

In an alternative, second embodiment, at low frequency in the through structure 230, an inductance part of the impedance to ground $Z_{p3}$ of the padset parasitic may be safely assumed to be much smaller than a resistance part of the impedance to ground $Z_{p3}$ and the impedance to ground $|Z_{c3}|$ of the internal through structure device. Likewise, at low frequency in the through structure 330, an inductance part of the impedance to ground $Z_{p4}$ of the padset parasitic may be safely assumed to be much smaller than a resistance part of the impedance to ground $Z_{p4}$ and the impedance to ground $|Z_{c4}|$ of the internal through structure device. Thus, the inductance parts of the impedances to ground $Z_{p3}$ and $Z_{p4}$ of the padset parasitics may be approximated to zero values. Under this approximation, the difference $\Delta y$ between the admittances to ground in the through structures 330, 230 is determined based on the following equation:

$$\Delta y = \frac{1}{i \operatorname{Im} Z_{L4}} - \frac{1}{i \operatorname{Im} Z_{L3}}. \tag{11}$$

Figure 10A:
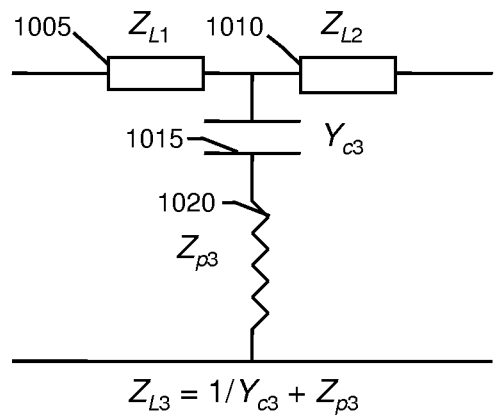
FIGS. 10A-10B are other exemplary schematics of equivalent circuits of the open-corrected Z-parameter matrices in accordance with aspects of the present invention.
Figure 10B:
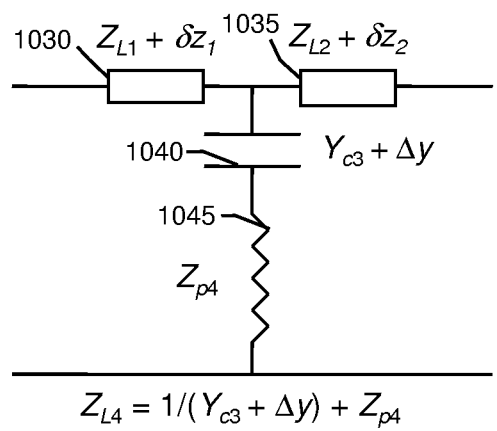

FIGS. 10A-10B are other exemplary schematics of equivalent circuits 1000, 1025 of the open-corrected Z-parameter matrices in accordance with aspects of the present invention. Specifically, in FIG. 10A, the circuit 1000 is the equivalent circuit of the open-corrected Z-parameter matrix $Z^{to1}$ for the through structure 230. The equivalent circuit 1000 includes a resistor-inductor, series-connected pair 1005 (e.g., the first port 235) having the impedance $Z_{L1}$, and a resistor-inductor, series-connected pair 1010 (e.g., the second port 240) having the impedance $Z_{L2}$. The equivalent circuit 1000 also includes a capacitor 1015 (e.g., the capacitance to ground of the internal through structure device) having the admittance to ground $Y_{c3}$, and a resistor 1020 (e.g., the padset parasitic) having the real part of the impedance to ground $Z_{p3}$. The inductance part of the impedance to ground $Z_{p3}$ is approximated to a zero value.

In FIG. 10B, the circuit 1025 is the equivalent circuit of the open-corrected Z-parameter matrix $Z^{to2}$ for the through structure 330. The equivalent circuit 1025 includes a resistor-inductor, series-connected pair 1030 (e.g., the first port 335) having the impedance ($Z_{L1}+\delta z_1$), and a resistor-inductor, series-connected pair 1035 (e.g., the second port 340) having the impedance ($Z_{L2}+\delta z_2$). The equivalent circuit 1025 also includes a capacitor 1040 (e.g., the capacitance to ground of the internal through structure device) having an admittance to ground ($Y_{c3}+\Delta y$), and a resistor 1045 (e.g., the padset parasitic) having the real part of the impedance to ground $Z_{p4}$. The inductance part of the impedance to ground $Z_{p4}$ is approximated to a zero value.

Assuming that the determined difference $\Delta y$ in admittance is proportional to a difference in length ($L_2-L_1$) of the through structures 330, 230, then an admittance difference per unit length is $\Delta y/(L_2-L_1)$. It is noted that:

$$L_2 - L_1 = l_2 - l_1, \tag{12}$$

where $L_2$ is the length of the capacitor 225, $L_1$ is the length of the capacitor 125, $l_2$ is the length of a core portion of the capacitor 225, and $l_1$ is the length of a core portion of the capacitor 225.

However, since $L_1$ and $L_2$ may be different than $l_1$ and $l_2$, respectively, to prevent typical over de-embedding, the RF de-embedding module 105 may subtract out an impedance $L_1 \delta z$ and an admittance $\delta y_1$ from the open-corrected Z-parameter matrix $Z^{to1}$ of the through structure 230. The admittance $\delta y_1$ is determined based on the following equation:

$$\delta y_1 = \frac{L_1 \Delta y}{L_2 - L_1}. \tag{13a}$$

The RF de-embedding module 105 may also subtract out an impedance $L_2 \delta z$ and an admittance $\delta y_2$ from the open-corrected Z-parameter matrix $Z^{to2}$ of the through structure 330. The admittance $\delta y_2$ is determined based on the following equation:

$$\delta y_2 = \frac{L_2 \Delta y}{L_2 - L_1}. \tag{13b}$$

Using these determined admittances $\delta y_1$ and $\delta y_2$, the open-corrected Z-parameter matrices $Z^{to1}$ and $Z^{to2}$, and the difference matrix $\Delta z$ between the open-corrected Z-parameter matrices $Z^{to1}$ and $Z^{to2}$, the RF de-embedding module 105 may determine the internal impedance matrices of the through structures 230, 330 ("the impedance corrections"). The 2×2 internal impedance matrix $\Delta Z^{to1}$ of the through structure 230 may be determined based on the following equation:

$$\Delta Z^{to1} = \begin{pmatrix} \frac{L_1}{L_2-L_1}(\Delta z_{11}-\Delta z_{21}) - \frac{(Z_{21}^{to1})^2 \delta y_1}{1-(Z_{21}^{to1})\delta y_1} & -\frac{(Z_{12}^{to1})^2 \delta y_1}{1-(Z_{12}^{to1})\delta y_1} \\ -\frac{(Z_{21}^{to1})^2 \delta y_1}{1-(Z_{21}^{to1})\delta y_1} & \frac{L_1}{L_2-L_1}(\Delta z_{22}-\Delta z_{12}) - \frac{(Z_{12}^{to1})^2 \delta y_1}{1-(Z_{12}^{to1})\delta y_1} \end{pmatrix}$$

$$= \begin{pmatrix} L_1 \delta z_l - \frac{(Z_{21}^{to1})^2 \delta y_1}{1-(Z_{21}^{to1})\delta y_1} & -\frac{(Z_{12}^{to1})^2 \delta y_1}{1-(Z_{12}^{to1})\delta y_1} \\ -\frac{(Z_{21}^{to1})^2 \delta y_1}{1-(Z_{21}^{to1})\delta y_1} & L_1 \delta z_r - \frac{(Z_{12}^{to1})^2 \delta y_1}{1-(Z_{12}^{to1})\delta y_1} \end{pmatrix}. \tag{14a}$$

The 2×2 internal impedance matrix $\Delta Z^{to2}$ of the through structure 330 may be determined based on the following equation:

$$\Delta Z^{to2} = \begin{pmatrix} \frac{L_2}{L_2-L_1}(\Delta z_{11}-\Delta z_{21}) - \frac{(Z_{21}^{to2})^2 \delta y_2}{1-(Z_{21}^{to2})\delta y_2} & -\frac{(Z_{12}^{to2})^2 \delta y_2}{1-(Z_{12}^{to2})\delta y_2} \\ -\frac{(Z_{21}^{to2})^2 \delta y_2}{1-(Z_{21}^{to2})\delta y_2} & \frac{L_2}{L_2-L_1}(\Delta z_{22}-\Delta z_{12}) - \frac{(Z_{12}^{to2})^2 \delta y_2}{1-(Z_{12}^{to2})\delta y_2} \end{pmatrix} \tag{14b}$$

-continued $$= \begin{pmatrix} L_2\delta z_l - \frac{(Z_{21}^{to2})^2 \delta y_2}{1-(Z_{21}^{to2})\delta y_2} & -\frac{(Z_{12}^{to2})^2 \delta y_2}{1-(Z_{12}^{to2})\delta y_2} \\ -\frac{(Z_{21}^{to2})^2 \delta y_2}{1-(Z_{21}^{to2})\delta y_2} & L_2\delta z_r - \frac{(Z_{12}^{to2})^2 \delta y_2}{1-(Z_{12}^{to2})\delta y_2} \end{pmatrix}.$$

In a third embodiment, the RF de-embedding module 105 may determine these impedance corrections via another process. Specifically, from the difference matrix $\Delta z$ between these Z-parameter matrices $Z^{to1}$ and $Z^{to2}$ in equation (5), the RF de-embedding module 105 may determine a difference between the impedances to ground of the through structures 330, 230. The difference $\Delta z_g$ between the impedances to ground of the through structures 330, 230 may be determined based on the following equation:

$$\Delta z_g = \frac{1}{2}(\Delta z_{21} + \Delta z_{12}) = \frac{1}{2}(Z_{21}^{to2} - Z_{21}^{to1} + Z_{12}^{to2} - Z_{12}^{to1}) = Z_{L4} - Z_{L3} \quad (15)$$

$$\approx Z_{c4} - Z_{c3} = \frac{1}{Y_{c4}} - \frac{1}{Y_{c3}}.$$

It is noted that the difference $\Delta z_g$ represents the difference between the impedances to ground of the two internal through structure devices $Z_{c4}$ and $Z_{c3}$ only, and the impedances to ground of the padset parasitics $Z_{p4}$ and $Z_{p3}$ are cancelled. The RF de-embedding module 105 may independently determine the impedances to ground of the two internal through structure devices $Z_{c4}$ and $Z_{c3}$ based on a relationship between their admittances $Y_{c3}$ and $Y_{c4}$. Particularly, assuming that a change in admittance between the internal through structure devices is proportional to a change in their length, a proportionality constant may be approximated as follows:

$$\frac{Y_{c3}}{Y_{c4}} \approx \frac{L_1}{L_2}. \quad (16a)$$

Using this approximation, the admittance $Y_{c4}$ may be denoted as a function of the admittance $Y_{c3}$ as follows:

$$Y_{c4} = Y_{c3}\left(\frac{L_2}{L_1}\right). \quad (16b)$$

Using this relation, the difference $\Delta z_g$ between the impedances to ground of the through structures 330, 230 may be denoted as follows:

$$\Delta z_g = \frac{1}{Y_{c4}} - \frac{1}{Y_{c3}} \approx \frac{1}{Y_{c3}\left(\frac{L_2}{L_1}\right)} - \frac{1}{Y_{c3}} = \frac{L_1 - L_2}{Y_{c3}L_2} \approx \frac{L_1 - L_2}{Y_{c4}L_1}. \quad (16c)$$

Accordingly, the RF de-embedding module 105 may independently determine the impedances to ground of the two internal through structure devices $Z_{c4}$ and $Z_{c3}$ based on the following equations:

$$Z_{c3} = \frac{1}{Y_{c3}} \approx \frac{L_2 \Delta z_g}{L_1 - L_2}; \text{ and} \quad (16d)$$

$$Z_{c4} = \frac{1}{Y_{c4}} \approx \frac{L_1 \Delta z_g}{L_1 - L_2}. \quad (16e)$$

Utilizing the impedances to ground of the two internal through structure devices $Z_{c4}$ and $Z_{c3}$, and the difference matrix $\Delta z$ between the open-corrected Z-parameter matrices $Z^{to1}$ and $Z^{to2}$, the RF de-embedding module 105 may determine the internal impedance matrices of the through structures 230, 330 ("the impedance corrections"). The 2×2 internal impedance matrix $\Delta Z^{to1}$ of the through structure 230 may be determined based on the following equation:

$$\Delta Z^{to1} = \begin{pmatrix} \frac{L_1}{L_2 - L_1}(\Delta z_{11} - \Delta z_{21}) + Z_{c3} & Z_{c3} \\ Z_{c3} & \frac{L_1}{L_2 - L_1}(\Delta z_{22} - \Delta z_{12}) + Z_{c3} \end{pmatrix} \quad (17a)$$

$$= \begin{pmatrix} L_1\delta z_l + Z_{c3} & Z_{c3} \\ Z_{c3} & L_1\delta z_r + Z_{c3} \end{pmatrix}.$$

The 2×2 internal impedance matrix $\Delta Z^{to2}$ of the through structure 330 may be determined by the following equation:

$$\Delta Z^{to2} = \begin{pmatrix} \frac{L_2}{L_2 - L_1}(\Delta z_{11} - \Delta z_{21}) + Z_{c4} & Z_{c4} \\ Z_{c4} & \frac{L_2}{L_2 - L_1}(\Delta z_{22} - \Delta z_{12}) + Z_{c4} \end{pmatrix} \quad (17b)$$

$$= \begin{pmatrix} L_2\delta z_l + Z_{c4} & Z_{c4} \\ Z_{c4} & L_2\delta z_r + Z_{c4} \end{pmatrix}.$$

As shown in equations (17a) and (17b), any inaccuracy in the determination of the impedances to ground of the two internal through structure devices $Z_{c4}$ and $Z_{c3}$ appears equally in all four terms of the internal impedance matrices $\Delta Z^{to1}$ and $\Delta Z^{to2}$. This implies that any error will appear equally in all four terms of the final de-embedded, open-corrected Y-parameter matrices of the DUT structures 200, 300. Specifically, this means that any inaccuracy in the determination of the impedances to ground of the two internal through structure devices $Z_{c4}$ and $Z_{c3}$ appears in the final de-embedded, open-corrected Y-parameter matrices of the DUT structures 200, 300 as an error in the impedance to ground. In two-port measurements, of passive devices in particular, this error is a parasitic that is often of secondary importance.

Last, utilizing the open-corrected Y-parameter matrices $Y^{do1}$ and $Y^{do2}$, the open-corrected Z-parameter matrices $Z^{to1}$ and $Z^{to2}$, and the impedance corrections $\Delta Z^{to1}$ and $\Delta Z^{to2}$, the RF de-embedding module 105 determines Y-parameter matrices $Y^{dev1}$ and $Y^{dev2}$ of the capacitors 225, 325, respectively, with the following equations:

$$Y^{dev1} = [(Y^{do1})^{-1} - Z^{to1} + \Delta Z^{to1}]^{-1}; \text{ and} \quad (18a)$$

$$Y^{dev2} = [(Y^{do2})^{-1} - Z^{to2} + \Delta Z^{to2}]^{-1}. \quad (18b)$$

For the first and second embodiments where the admittance $\delta y_1$ and $\delta y_2$ are determined, the Y-parameter matrices $Y^{dev1}$ and $Y^{dev2}$ of the capacitors 225, 325, respectively, may be denoted as follows:

$$Y^{dev1} = \left[(Y^{do1})^{-1} - \tilde{Z}^{to1}\right]^{-1} ; \text{ and} \tag{19a}$$

$$Y^{dev2} = \left[(Y^{do2})^{-1} - \tilde{Z}^{to2}\right]^{-1}, \text{ where} \tag{19b}$$

$$\tilde{Z}^{to1} = Z^{to1} - \Delta Z^{to1}$$

$$= \begin{pmatrix} Z_{11}^{to1} - \frac{L_1}{L_2 - L_1}(\Delta z_{11} - \Delta z_{21}) + & \\ \frac{(Z_{21}^{to1})^2 \delta y_1}{1 - (Z_{21}^{to1})\delta y_1} & \frac{1}{(Z_{12}^{to1})^{-1} - \delta y_1} \\ & \\ \frac{1}{(Z_{21}^{to1})^{-1} - \delta y_1} & Z_{22}^{to1} - \frac{L_1}{L_2 - L_1}(\Delta z_{22} - \Delta z_{12}) + \\ & \frac{(Z_{12}^{to1})^2 \delta y_1}{1 - (Z_{12}^{to1})\delta y_1} \end{pmatrix}$$

$$= \begin{pmatrix} Z_{11}^{to1} - L_1 \delta z_l + \frac{(Z_{21}^{to1})^2 \delta y_1}{1 - (Z_{21}^{to1})\delta y_1} & \frac{1}{(Z_{12}^{to1})^{-1} - \delta y_1} \\ \frac{1}{(Z_{21}^{to1})^{-1} - \delta y_1} & Z_{22}^{to1} - L_1 \delta z_r + \frac{(Z_{12}^{to1})^2 \delta y_1}{1 - (Z_{12}^{to1})\delta y_1} \end{pmatrix}, \text{ and}$$

(19c)

$$\tilde{Z}^{to2} = Z^{to2} - \Delta Z^{to2}$$

$$= \begin{pmatrix} Z_{11}^{to2} - \frac{L_2}{L_2 - L_1}(\Delta z_{11} - \Delta z_{21}) + & \\ \frac{(Z_{21}^{to2})^2 \delta y_2}{1 - (Z_{21}^{to2})\delta y_2} & \frac{1}{(Z_{12}^{to2})^{-1} - \delta y_2} \\ & \\ \frac{1}{(Z_{21}^{to2})^{-1} - \delta y_2} & Z_{22}^{to2} - \frac{L_2}{L_2 - L_1}(\Delta z_{22} - \Delta z_{12}) + \\ & \frac{(Z_{21}^{to2})^2 \delta y_2}{1 - (Z_{21}^{to2})\delta y_2} \end{pmatrix}$$

$$= \begin{pmatrix} Z_{11}^{to2} - L_2 \delta z_l + \frac{(Z_{21}^{to2})^2 \delta y_2}{1 - (Z_{21}^{to2})\delta y_2} & \frac{1}{(Z_{12}^{to2})^{-1} - \delta y_2} \\ \frac{1}{(Z_{21}^{to2})^{-1} - \delta y_2} & Z_{22}^{to2} - L_2 \delta z_r + \frac{(Z_{21}^{to2})^2 \delta y_2}{1 - (Z_{21}^{to2})\delta y_2} \end{pmatrix}.$$

(19d)

Advantageously, the invention leads to a more accurate characterization of an RF device, such as the capacitors 225 and 325. Specifically, in the example of the capacitors 225 and 325, the invention leads to more accurate Y-parameter matrices $Y^{dev1}$ and $Y^{dev2}$ of the capacitors 225, 325. This is because the internal impedance matrices $\Delta Z^{to1}$ and $\Delta Z^{to2}$ of the through structures 230, 330 are determined and added back into the Y-parameter matrices $Y^{dev1}$ and $Y^{dev2}$ instead of being subtracted from these parameters.

Flow Diagrams

Figure 11A:
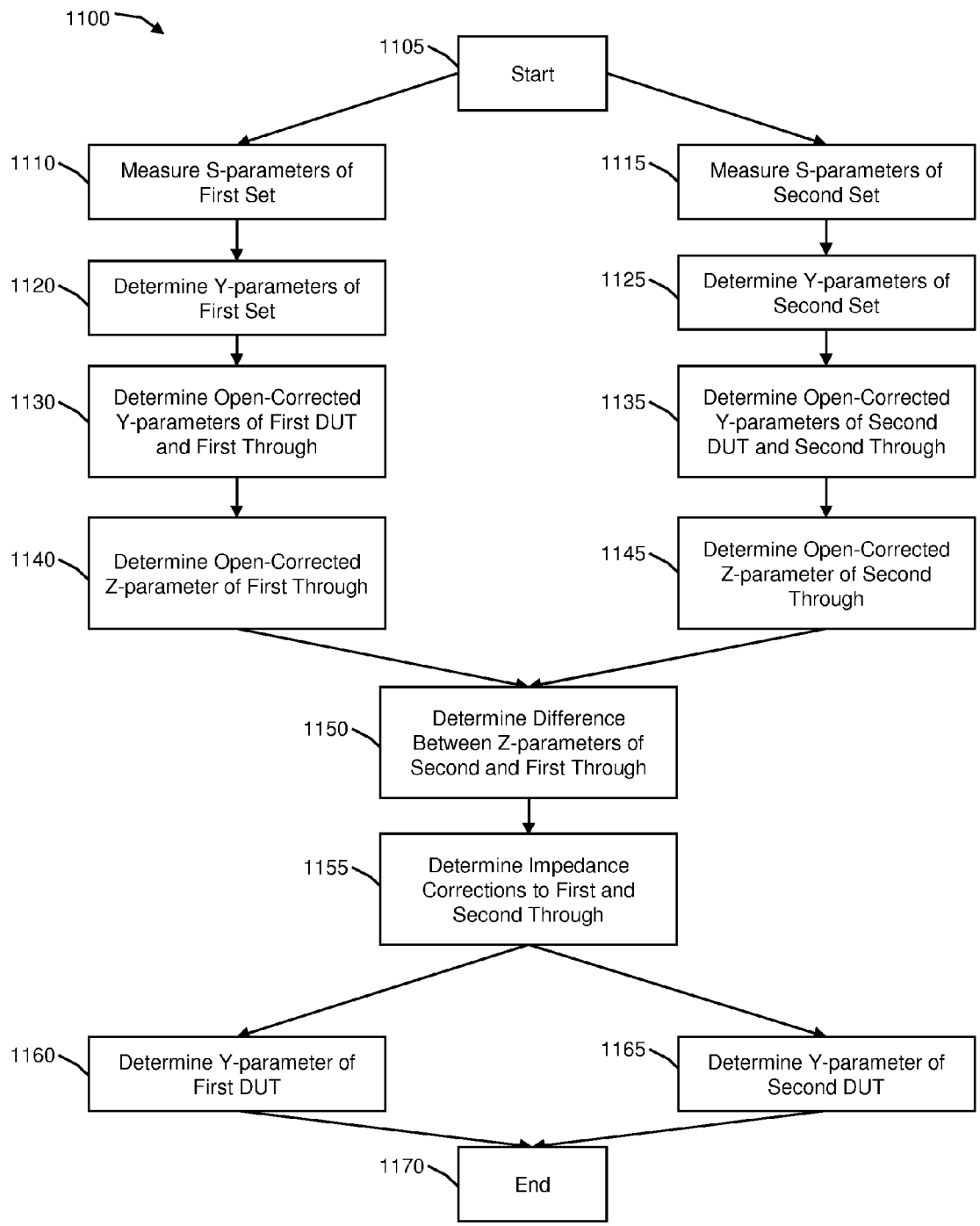
FIGS. 11A-11C are exemplary flow diagrams of methods for the RF de-embedding in accordance with aspects of the present invention.
Figure 11B:
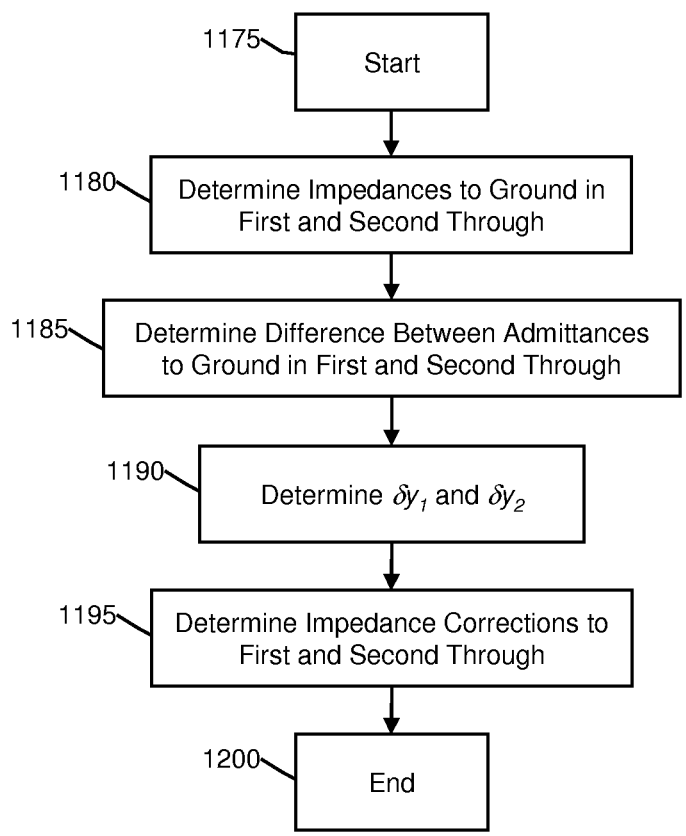
Figure 11C:
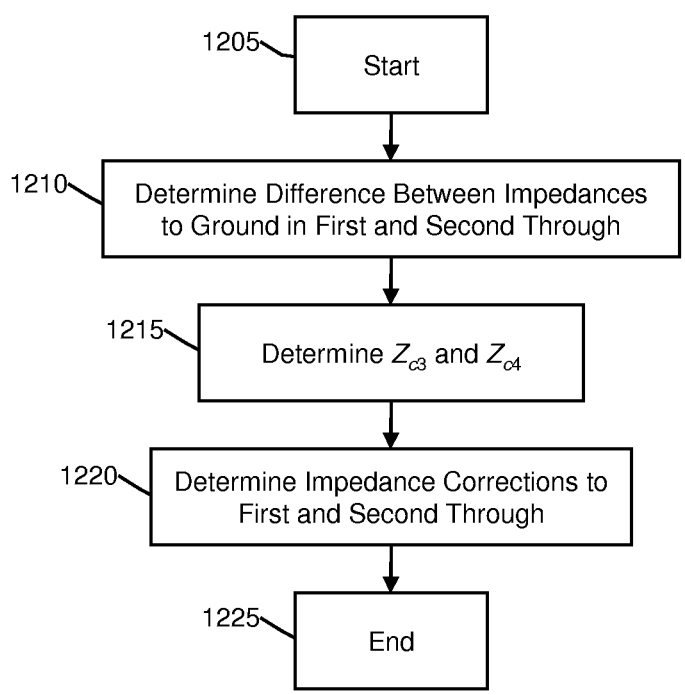

FIGS. 11A-11C show exemplary flows for performing aspects of the present invention. The steps of FIGS. 11A-11C may be implemented in the environment of FIG. 1, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

FIG. 11A is an exemplary flow diagram of a process 1100 for RF de-embedding of a device. At step 1105, the process starts. At step 1110, an RF de-embedding module (e.g., the RF de-embedding module 105 in FIG. 1) measures three separate 2×2 S-parameter matrices $S_{dut1}$, $S_{through1}$, and $S_{open1}$ of a first set of structures (e.g., the DUT structure 200, the through structure 230, and the open structure 260 in FIGS. 2A-2C). At step 1115, the RF de-embedding module measures three separate 2×2 S-parameter matrices $S_{dut2}$, $S_{through2}$, and $S_{open2}$ of a second set of structures (e.g., the DUT structure 300, the through structure 330, and the open structure 360 in FIGS. 3A-3C).

At step 1120, the RF de-embedding module determines three separate 2×2 Y-parameter matrices $Y_{dut1}$, $Y_{through1}$, and $Y_{open1}$ of the first set of structures that correspond to the matrices $S_{dut1}$, $S_{through1}$, and $S_{open1}$, respectively. At step 1125, the RF de-embedding module determines three separate 2×2 Y-parameter matrices $Y_{dut2}$, $Y_{through2}$, and $Y_{open2}$ of the second set of structures that correspond to the matrices $S_{dut2}$, $S_{through2}$, and $S_{open2}$, respectively. At step 1130, the RF de-embedding module determines open-corrected Y-parameter matrices $Y^{do1}$ and $Y^{to1}$ of a first DUT structure (e.g., the DUT structure 200) and a first through structure (e.g., the through structure 230) based on the Y-parameters matrices $Y_{dut1}$, $Y_{through1}$, and $Y^{open1}$. At step 1135, the RF de-embedding module determines open-corrected Y-parameters matrices $Y^{do2}$ and $Y^{to2}$ of a second DUT structure (e.g., the DUT structure 300) and a second through structure (e.g., the through structure 330) based on the Y-parameters matrices $Y_{dut2}$, $Y_{through2}$, and $Y_{open2}$.

At step 1140, the RF de-embedding module determines an open-corrected Z-parameter matrix $Z^{to1}$ of the first through structure based on the open-corrected Y-parameter matrix $Y^{to1}$. At step 1145, the RF de-embedding module determines an open-corrected Z-parameter matrix $Z^{to2}$ of the second through structure based on the open-corrected Y-parameter matrix $Y^{to2}$. At step 1150, the RF de-embedding module determines a difference matrix $\Delta z$ between these Z-parameter matrices $Z^{to1}$ and $Z^{to2}$. At step 1155, in embodiments, the RF de-embedding module determines impedance corrections $\Delta Z^{to1}$ and $\Delta Z^{to2}$ of the through structures based on the open-corrected Z-parameter matrices $Z^{to1}$ and $Z^{to2}$, and the difference matrix $\Delta z$ between the open-corrected Z-parameter matrices $Z^{to1}$ and $Z^{to2}$.

At step 1160, the RF de-embedding module determines a Y-parameter matrix $Y^{dev1}$ of a device in the first set of structures based on the open-corrected Y-parameter matrix $Y^{do1}$, the open-corrected Z-parameter matrix $Z^{to1}$, and the impedance correction $\Delta Z^{to1}$. At step 1165, the RF de-embedding module determines a Y-parameter matrix $Y^{dev2}$ of a device in the second set of structures based on the open-corrected Y-parameter matrix $Y^{do2}$, the open-corrected Z-parameter matrix $Z^{to2}$, and the impedance correction $\Delta Z^{to2}$. At step 1170, the process ends.

FIG. 11B is an exemplary flow diagram of a process for the determining of the impedance corrections $\Delta Z^{to1}$ and $\Delta Z^{to2}$ of the through structures (e.g., the step 1155 in FIG. 11A). At step 1175, the process starts. At step 1180, the RF de-embedding module determines impedance to ground $Z_{L4}$ and $Z_{L3}$ in the through structures based on the open-corrected Z-parameters $Z^{to1}$ and $Z^{to2}$. At step 1185, in embodiments, the RF de-embedding module determines a difference $\Delta y$ between admittances to ground in the through structures based on the impedance to ground $Z_{L4}$ and $Z_{L3}$.

At step 1190, the RF de-embedding module determines admittances $\delta y_1$ and $\delta y_2$ based on the difference $\Delta y$ between admittances to ground and lengths $L_1$ and $L_2$ of the through structures. At step 1195, the RF de-embedding module determines the impedance corrections $\Delta Z^{to1}$ and $\Delta Z^{to2}$ of the through structures based on the open-corrected Z-parameter matrices $Z^{to1}$ and $Z^{to2}$, the difference matrix $\Delta z$ between the open-corrected Z-parameter matrices $Z^{to1}$ and $Z^{to2}$, and the admittances $\delta y_1$ and $\delta y_2$. At step 1200, the process ends.

FIG. 11C is an exemplary flow diagram of another process for the determining of the impedance corrections $\Delta Z^{to1}$ and $\Delta Z^{to2}$ of the through structures (e.g., the step 1155 in FIG. 11A). At step 1205, the process starts. At step 1210, the RF de-embedding module determines a difference $\Delta z_g$ between impedances to ground of the through structures based on the open-corrected Z-parameters $Z^{to1}$ and $Z^{to2}$. At step 1215, the RF de-embedding module determines impedances to ground of internal through structure devices $Z_{c4}$ and $Z_{c3}$ in the through structures based on the difference $\Delta z_g$ between impedances to ground and the lengths $L_1$ and $L_2$. At step 1220, the RF de-embedding module determines the impedance corrections $\Delta Z^{to1}$ and $\Delta Z^{to2}$ of the through structures based on the open-corrected Z-parameter matrices $Z^{to1}$ and $Z^{to2}$, the difference matrix $\Delta z$ between the open-corrected Z-parameter matrices $Z^{to1}$ and $Z^{to2}$, and the impedances to ground of internal through structure devices $Z_{c4}$ and $Z_{c3}$. At step 1225, the process ends.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A structure, comprising:
    a first set of test structures comprising:
        a first device under test (DUT) structure comprising a first capacitor having a first length;
        a first through structure corresponding to the first DUT structure; and
        a first open structure corresponding to the first DUT structure; and
    a second set of test structures comprising:
        a second device under test (DUT) structure comprising a second capacitor having a second length different than the first length but otherwise identical to the first capacitor;
        a second through structure corresponding to the second DUT structure; and
        a second open structure corresponding to the second DUT structure.

2. The structure of claim 1, wherein:
    the first capacitor comprises a first two-terminal device; and
    the second capacitor comprises a second two-terminal device.

3. The structure of claim 1, wherein:
    the first capacitor is connected in series to a first input port and a first output port; and
    the second capacitor is connected in series to second input port and a second output port.

4. The structure of claim 1, wherein:
    the first through structure comprises a first input port and a first output port connected by a first core portion having a first length; and
    the second through structure comprises a second input port and a second output port connected by a second core portion having a second length that is different than the first length.

5. The structure of claim 4, wherein:
    the first core portion has a first width that is same as widths of portions of the first through structure connected to the first core portion; and
    the second core portion has a second width that is same as widths of portions of the second through structure connected to second core portion.

6. The structure of claim 1, wherein:
the first open structure comprises a first input port, a first output port, and an open circuit between the first input port and the first output port; and
the second open structure comprises a second input port, a second output port, and an open circuit between the second input port and the second output port.

7. The structure of claim 1, wherein:
the first capacitor comprises a first vertical natural capacitor (VNCAP); and
the second capacitor comprises a second vertical natural capacitor (VNCAP).

8. The structure of claim 7, wherein:
the first VNCAP has a first width; and
the second VNCAP has a second width equal to the first width.

9. The structure of claim 8, wherein:
the first through structure comprises a first input port and a first output port connected by a first core portion having a first core length and a first width;
the second through structure comprises a second input port and a second output port connected by a second core portion having a second core length and a second width;
the second core length is different than the first core length; and
the second width is equal to the first width.

10. The structure of claim 9, wherein the first set of test structures and the second set of test structures are configured for determining a first electrical parameter of the first capacitor and a second electrical parameter of the second capacitor based on measured S-parameters of the first set of test structures and measured S-parameters of the first set of test structures.

11. The structure of claim 1, further comprising:
a first set of probes configured for connecting to respective ports of the first DUT structure, the first through structure, and the first open structure; and
a second set of probes configured for connecting to respective ports of the second DUT structure, the second through structure, and the second open structure.

12. The structure of claim 11, wherein the first set of probes and the second set of probes are connected to a computer device comprising an RF de-embedding module that is programmed for: measuring first scattering parameters (S-parameters) of the first set of test structures; measuring second scattering parameters (S-parameters) of the second set of test structures; determining a first electrical parameter of the first capacitor and a second electrical parameter of the second capacitor based on the first S-parameters and the second S-parameters; and storing the first electrical parameter and the second electrical parameter.

13. A structure, comprising:
a first test device;
a first through structure corresponding to the first test device;
a first open structure corresponding to the first test device;
a second test device having at least one different physical dimension than the first test device but otherwise identical to the first test device;
a second through structure corresponding to the second test device;
a second open structure corresponding to the second test device;
first probes placed on a first set of structures for measurement of the first set of structures; and
second probes placed on a second set of structures for measurement of the second set of structures and placed a same distance apart as the first probes.

14. The structure of claim 13, wherein:
the first through structure comprises a first input port and a first output port connected by a first core portion having a first length ($L_1$) and a first width;
the second through structure comprises a second input port and a second output port connected by a second core portion having a second length ($L_2$) and a second width;
the second length ($L_2$) is different than the first length ($L_1$); and
the second width is equal to the first width.

15. The structure of claim 14, wherein a distance between the first probes is the same as a distance between the second probes and is given as: $[x_1 + \frac{1}{2}(L_1 + L_2) + x_2]$,
where $x_1$ and $x_2$ represent non-core portions of the first and second through structures;
$L_1$ is the first length of the first core portion; and
$L_2$ is the second length of the second core portion.

* * * * *